United States Patent
Prinz

(10) Patent No.: US 7,211,858 B2
(45) Date of Patent: May 1, 2007

(54) SPLIT GATE STORAGE DEVICE INCLUDING A HORIZONTAL FIRST GATE AND A VERTICAL SECOND GATE IN A TRENCH

(75) Inventor: Erwin J. Prinz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/188,603

(22) Filed: Jul. 25, 2005

(65) Prior Publication Data

US 2007/0018207 A1 Jan. 25, 2007

(51) Int. Cl.
*H01L 29/792* (2006.01)

(52) U.S. Cl. .......... 257/324; 257/316; 257/E29.275; 257/E29.305

(58) Field of Classification Search ........ 257/314, 257/315, 324, 325, E27.102, E27.103, 316, 257/318, 320, 321, 390, 391, E29.129, E29.275, 257/E29.305, E29.309
See application file for complete search history.

(56) References Cited

U.S. PATENT DOCUMENTS

| | | | |
|---|---|---|---|
| 5,705,415 A | 1/1998 | Orlowski et al. | |
| 5,969,383 A | 10/1999 | Chang et al. | |
| 6,307,782 B1 | 10/2001 | Sadd et al. | |
| 6,330,184 B1 | 12/2001 | White et al. | |
| 6,399,441 B1 | 6/2002 | Ogura et al. | |
| 6,583,466 B2 | 6/2003 | Lin et al. | |
| 6,674,120 B2* | 1/2004 | Fujiwara | 257/324 |
| 6,706,599 B1 | 3/2004 | Sadd et al. | |
| 6,818,512 B1 | 11/2004 | Hsieh | |
| 6,894,339 B2* | 5/2005 | Fan et al. | 257/314 |
| 7,015,537 B2* | 3/2006 | Lee et al. | 257/316 |
| 7,112,490 B1 | 9/2006 | Hong et al. | |
| 2002/0151136 A1 | 10/2002 | Lin et al. | |
| 2003/0062565 A1 | 4/2003 | Yamazaki et al. | |
| 2003/0068864 A1 | 4/2003 | Il-Yong et al. | |
| 2004/0000688 A1 | 1/2004 | Harari et al. | |
| 2004/0121540 A1 | 6/2004 | Lin | |
| 2004/0248371 A1 | 12/2004 | Wang | |
| 2005/0037576 A1 | 2/2005 | Chen et al. | |
| 2005/0259475 A1 | 11/2005 | Forbes | |

(Continued)

OTHER PUBLICATIONS

Osabe, et al. "Charge-Injection Length in Silicon Nanocrystal Memory Cells," VLSI, p. 242, 2004.

(Continued)

*Primary Examiner*—Minhloan Tran
*Assistant Examiner*—Benjamin Tzu-Hung Liu

(57) ABSTRACT

A split gate memory cell can include a first gate electrode and a second gate electrode. The split gate memory cell can also include a first diffusion region underlying a trench in a semiconductor substrate, wherein the trench has a sidewall, and the first diffusion region lies closer to the first gate electrode than the second gate electrode. The split gate memory cell can further include a second diffusion region lying outside the trench, wherein the second diffusion region lies closer to the second gate electrode than the first gate electrode. The split gate memory cell can still further include a charge storage layer adjacent to the sidewall of the trench, wherein the charge storage layer includes discontinuous storage elements. Methods of forming and using the split gate memory cell are also disclosed.

20 Claims, 6 Drawing Sheets

U.S. PATENT DOCUMENTS

2005/0280089 A1   12/2005   Forbes
2005/0280094 A1   12/2005   Forbes
2006/0152978 A1   7/2006    Forbes
2006/0166443 A1   7/2006    Forbes

OTHER PUBLICATIONS

Ma, et al. "A Dual-Bit Split-Gate EEPROM (DSG) Cell in Contactless Array for Single-Vcc High Density Flash Memories," IEDM, p. 57-60, 1994.

"Twin MONOS Cell with Dual Control Gates," VLSI Technology, Source-Side Injection Cell with Two Storage Regions Forming in Nitride, p. 122, 2000.

"Vertical Floating-Gate 4.5/sup 2/split-gate NOR Flash Memory at 110nm Node," VLSI Technology, Source-Side Injection Cell in a Trench, p. 72, 2004.

U.S. Appl. No. 10/961,295, filed Oct. 8, 2004.

U.S. Appl. No. 11/079,674, filed Mar. 14, 2005.

Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.

Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.

U.S. Appl. No. 11/188,935, filed Jul. 25, 2005.
U.S. Appl. No. 11/188,999, filed Jul. 25, 2005.
U.S. Appl. No. 11/188,953, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,909, filed Jul. 25, 2005.
U.S. Appl. No. 11/188,591, filed Jul. 25, 2005.
U.S. Appl. No. 11/188,939, filed Jul. 25, 2005.
U.S. Appl. No. 11/188,588, filed Jul. 25, 2005.
U.S. Appl. No. 11/188,584, filed Jul. 25, 2005.
U.S. Appl. No. 11/188,615, filed Jul. 25, 2005.
U.S. Appl. No. 11/188,582, filed Jul. 25, 2005.
U.S. Appl. No. 11/188,583, filed Jul. 25, 2005.
U.S. Appl. No. 11/188,585, filed Jul. 25, 2005.

Hayashi, Y., et al. "Twin MONOS Cell with Dual Control Gates," 2000 Symposium on VLSI Technology Digest of Technical Papers, pp. 122-123, 2000.

Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

U.S. Appl. No. 11/525,747, filed Sep. 22, 2006.

* cited by examiner

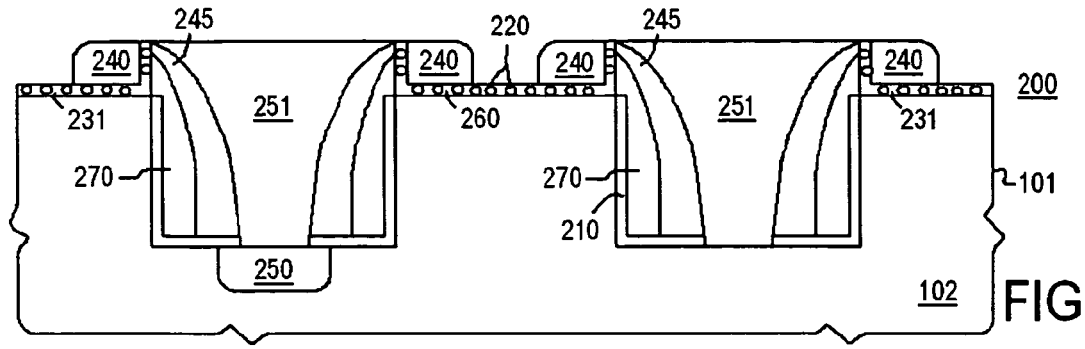
FIG. 16
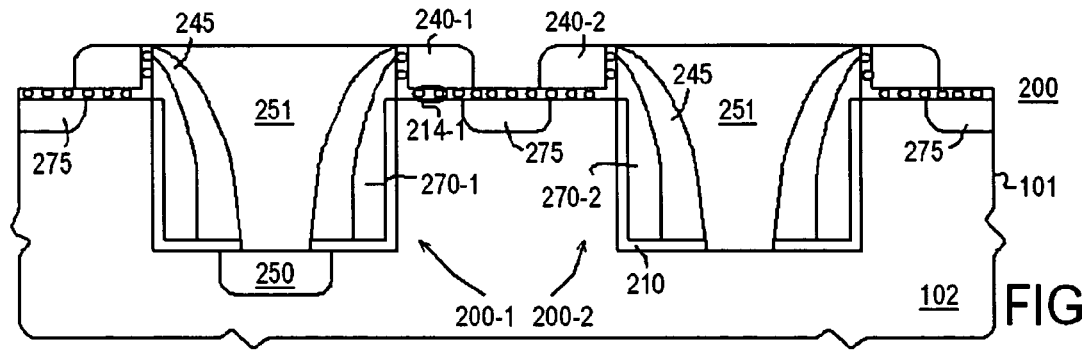
FIG. 17
PROGRAM/ERASE TABLE (FOR DEVICE OF FIG. 12 OR 17)
| OPERATION | CG 140-1 | CG 140-2 | SG 170-1 | SG 170-1 | DIFF 175 | DIFF 150-1 | DIFF 150-2 | WELL 102 |
|---|---|---|---|---|---|---|---|---|
| INJECTION REGION 114-1 | $V_{P1}$ | X | $V_{P3}$ | X | $V_{P4}$ | $V_{P2}$ | X | $V_{P4}$ |
| INJECTION REGION 114-2 | X | $V_{P1}$ | X | $V_{P3}$ | $V_{P4}$ | X | $V_{P2}$ | $V_{P4}$ |
| ERASE | $V_{E1}$ | $V_{E1}$ | X | X | X | X | X | $V_{E2}$ |
|  |  |  |  |  |  |  |  |  |
$V_{P1}$= 6 V   $V_{P3}$= 1 V   $V_{E1}$= -6 V   X=No Connect
$V_{P2}$= 5 V   $V_{P4}$= 0 V   $V_{E2}$= 6 V
180
FIG. 18

SPLIT GATE STORAGE DEVICE INCLUDING A HORIZONTAL FIRST GATE AND A VERTICAL SECOND GATE IN A TRENCH

FIELD OF THE INVENTION

The invention is in the field of semiconductor devices and, more particularly, nonvolatile storage devices.

RELATED ART

A conventional split-gate storage device 10 is depicted in FIG. 19. Split gate storage device 10 includes first and second gate electrodes 16 and 18 arranged in series between a pair of source/drain regions 12-1 and 12-2. A dielectric 20 separates gate electrodes 16 and 18 from semiconductor substrate 11. The dielectric 20 underlying gate electrode 16 includes charge storage elements 22 for programming bits of information as is known in the field of nonvolatile storage devices. Storage device 10 is referred to as a split-gate device because the channel 14 between source/drain regions 12-1 and 12-2 is controlled by distinct first and second gates 16 and 18. Split gate storage devices are desirable to achieve efficient programming through carrier injection at low programming currents. The efficiency of the injection mechanism is controlled by the voltage of first gate electrode 16 (which is sometimes referred to as the control gate) and the voltage on the source/drain region 12-1, while the programming current is controlled by the second gate electrode 18. By applying a relatively large potential to first gate electrode 16 and a relatively small potential to second gate electrode 18, adequate injection efficiency can be achieved at desirably low programming currents.

While the benefits of split-gate device 10 are apparent in the context of programmable nonvolatile storage devices, the design of conventional split-gate device 10, with the first and second gates both consuming precious wafer area, has an adverse impact on the cell density. Cell density refers to the amount of information that can be stored in a defined area. It would be desirable to implement a split-gate device exhibiting the beneficial characteristics of split-gate device 10, but occupying a smaller area and thereby capable of achieving greater density.

BRIEF DESCRIPTION OF THE DRAWINGS

The present invention is illustrated by way of example and not limited by the accompanying figures, in which like references indicate similar elements, and in which:

FIG. 16 depicts processing subsequent to FIG. 15 in which a charge storage stack is formed on exposed portions of the substrate and control gates formed on exterior sidewalls of the trench liner dielectric;

FIG. 17 depicts processing subsequent to FIG. 16 in which diffusion regions are formed in upper portions of the substrate aligned to the control gates;

FIG. 18 is a programming table for the split gate storage devices of FIG. 12 and FIG. 17;

Figure 20:
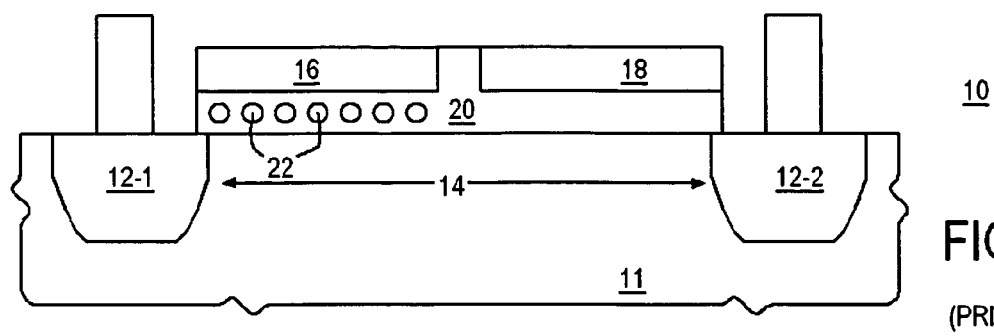
FIG. 20 is a cross section of a conventional split gate storage device.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor-based storage cell and a corresponding fabrication process employ a split-gate structure including a control gate and a select gate. One of the gates is oriented horizontally, on an upper surface of the substrate, while the other gate is oriented vertically, within a trench defined in the wafer substrate. The control gate overlies or is adjacent to a charge storage stack that includes a layer of discontinuous storage elements (DSEs). In some embodiments, the control gate is oriented vertically within the trench and the select gate is oriented horizontally. In other embodiments, the select gate is the vertically oriented gate in the trench and the control gate is the horizontally oriented gate overlying the substrate upper surface. In some embodiments, the layer of DSEs are silicon nanocrystals.

Referring to the drawings, FIG. 1 through FIG. 12 depict a set of partial cross sectional views of a wafer at various stages in process for fabricating an embodiment of a split-gate nonvolatile storage device 100, in which the control gate is vertically oriented within a trench and the select gate is horizontally oriented overlying the substrate upper surface. FIG. 13 through FIG. 17 depict an alternative processing, in lieu of the processing depicted in FIG. 3 through FIG. 11, for fabricating a second embodiment of a split-gate storage device 200 in which the select gate is vertically oriented in a trench and the control gate is horizontally oriented overlying the substrate upper surface.

Figure 1:
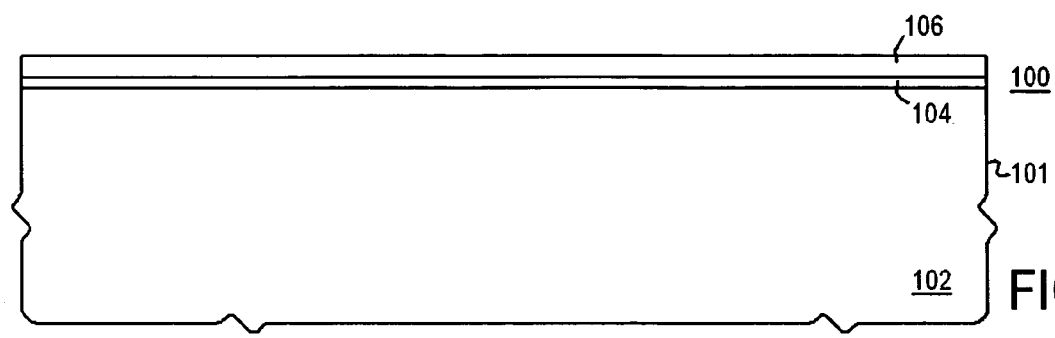
FIG. 1 is a partial cross sectional view of a wafer at an intermediate stage in a fabrication process in which a hard mask is formed on a dielectric liner over a semiconductor substrate.

In FIG. 1, a dielectric liner 104 and a hard mask 106 are formed on an upper surface of a semiconductor substrate 102 of a semiconductor wafer 101. Semiconductor substrate is preferably doped or undoped monocrystalline silicon. In other embodiments, semiconductor substrate may include other semiconductors such as germanium or various semiconductor alloys such as the III–V semiconductor alloys including gallium arsenide.

In one embodiment, dielectric liner 104 is silicon oxide, which may be thermally formed (grown) or deposited using CVD (chemical vapor deposition). Hard mask 106 is preferably a dielectric that can be selectively etched with respect to substrate 102. Hard mask 106 is preferably CVD silicon nitride, which is desirable for its ability to prevent oxidation of an underlying semiconductor. Hard mask layer 106 is preferably significantly thicker than dielectric liner 140. For example, hard mask layer 106 is in the range of 100 to 200 nm thick in one implementation while dielectric liner 104 is less than 20 nm. These relative dimensions are not reflected in the drawings, which are not to scale.

Figure 2:
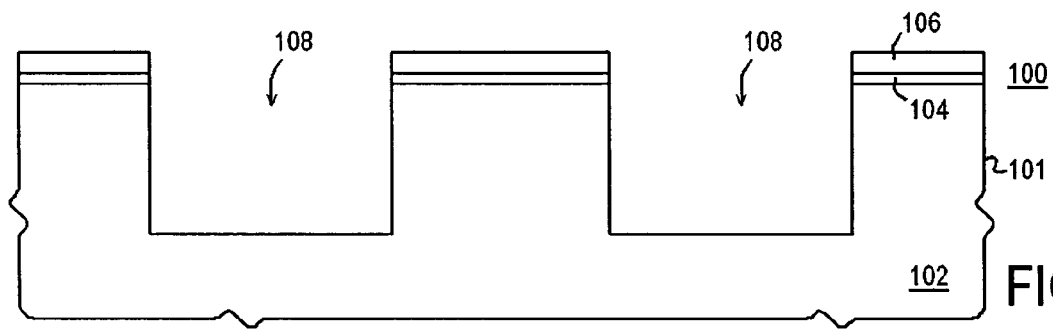
FIG. 2 depicts processing subsequent to FIG. 1 in which trenches are formed in the semiconductor substrate.

Referring now to FIG. 2, trenches 108 are formed in semiconductor substrate 102. Trenches 108 define the structure of the storage device to be formed as will be evident from the following description. Formation of trenches 108 includes conventional photolithographic patterning of dielectric liner 104 and hard mask 106 followed by a dry etch process that etches the semiconductor material (e.g., silicon) preferentially with respect to liner 104 and hard mask 106. Etch processes of this type are well known in the field of semiconductor fabrication. In the depicted implementation, trenches 108 have an aspect ratio of approximately 1:2. A depth of trenches 108 is an implementation detail, but trenches having a depth in the range of approximately 50 nm to 300 nm are desirable for applications requiring dense storage arrays.

Figure 3:
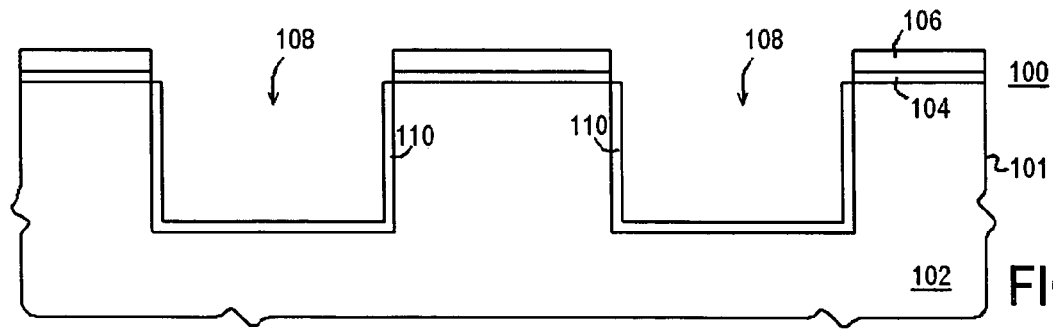
FIG. 3 depicts processing subsequent to FIG. 2 in which the trenches are lined with a bottom dielectric.

In FIG. 3, a first step in the formation of a charge storage stack is depicted, namely, the formation of a dielectric, referred to herein as bottom dielectric 110, on sidewalls and the floors of trenches 108. Bottom dielectric 110 is preferably a thin (e.g., 1 nm to 10 nm) high quality dielectric that is employed in the programming and erasing of the DSEs. A thin dielectric is preferred to achieve adequate programming times using either injection-based or tunneling-based programming techniques. A high quality dielectric is preferred to withstand the potentially large programming voltages and current and the potentially large number of programming cycles without exhibiting breakdown, trap-up, or significant leakage. In the preferred embodiment, bottom dielectric 110 is a thermally formed silicon dioxide film having a thickness in the range of approximately 4 to 10 nm. As depicted in FIG. 3, where hard mask 106 is a silicon nitride hard mask, thermal oxidation of the trench walls does not form substantial additional oxide under near silicon nitride hard mask 106.

Figure 4:
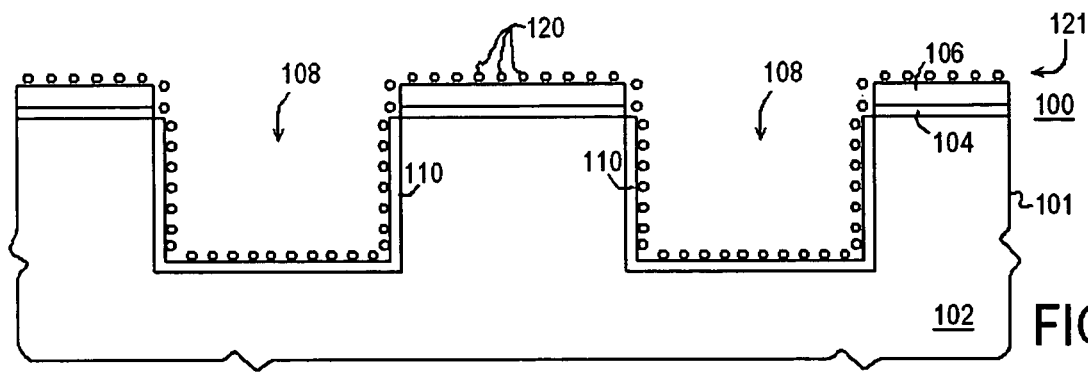
FIG. 4 depicts processing subsequent to FIG. 5 in which a layer of discontinuous storage elements is deposited.

In FIG. 4, a charge storage layer 121 has been non-selectively formed on bottom oxide 110 and an upper surface of hard mask 106. Charge storage layer 121 represents the structure in or on which charge will be stored to program or erase the bit or bits of storage device 100. In the depicted embodiment, charge storage layer 121 includes a plurality of DSEs 120. DSEs 120, which are implemented as nanocrystals in some embodiments, are a set of discreet accumulations of a material capable of storing a charge. Suitable materials include silicon, polysilicon, metal materials including titanium, tantalum, aluminum, alloys thereof, and the like, and dielectrics such as silicon nitride or silicon oxynitride.

In the preferred implementation, DSEs 120 are silicon nanocrystals. In this implementation, DSEs 120 may be formed in any one of a variety of ways, preferably without requiring any photolithography steps. One well-known DSE formation technique is to deposit an amorphous silicon layer and heat it to form the nanocrystals. Another technique is to deposit the nanocrystals using chemical vapor deposition (CVD). DSEs may have various shapes, including hemispherical and spherical, depending upon the deposition technique employed. In one implementation, DSEs 120 are approximately 10 nm in diameter and are spaced at a predominantly uniform spacing of approximately 10 nm. Regardless of the formation technique used, each DSE 120 in this embodiment is a particle of silicon that is electrically and physically isolated from its neighbors.

Figure 5:
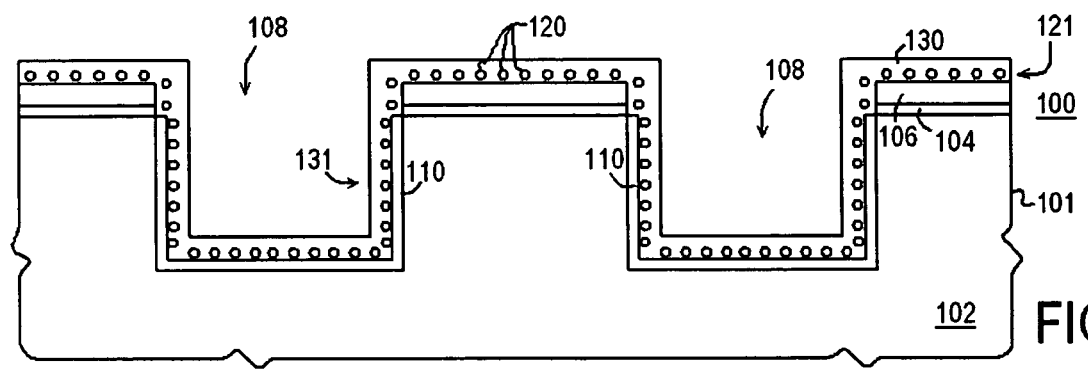
FIG. 5 depicts processing subsequent to FIG. 6 in which a top dielectric is formed on the layer of discontinuous storage elements.

Referring to FIG. 5, a top dielectric 130 has been non-selectively formed overlying charge storage layer 121 to complete the formation of a charge storage stack 131, which includes bottom dielectric 110, charge storage layer 121, and top dielectric 130. In the preferred embodiment, top dielectric 130 is a high temperature oxide (HTO) desirable for exhibiting characteristics (e.g., density and dielectric strength) substantially equivalent to thermally formed silicon dioxide. In this embodiment, top dielectric 130 may be formed by a conventional HTO process such as by reacting dichlorosilane and nitrous oxide at temperatures approaching 900 C. In other embodiments, it may be desirable to employ a lower temperature process (e.g., a TEOS (tetraethylorthosilicate) process) to prevent unintended oxidation of the silicon embodiments of DSEs 120. A thickness of top dielectric 130 is preferably in the range of approximately 5 to 10 nm.

Figure 6:
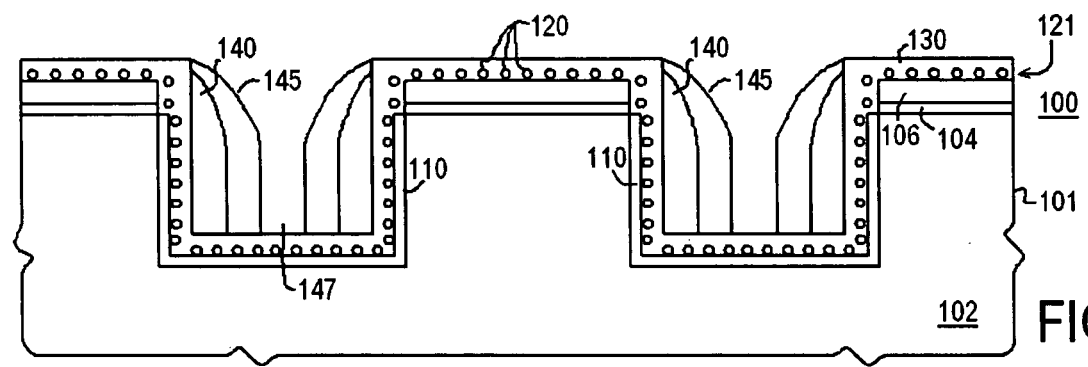
FIG. 6 depicts processing subsequent to FIG. 5 in which control gate spacers and dielectric liners are formed adjacent to the trench sidewalls.

Referring now to FIG. 6, control gate spacers 140 are formed in trenches 108 overlying a portion of charge storage stack 131 on the trench floor and adjacent to the portion of charge storage stack 131 on the trench sidewalls. Control gates spacers 140 are formed in the preferred embodiment by non-selectively depositing an electrically conductive control gate material over wafer 101 and trenches 108 and then etching the deposited material anisotropically as is well known in the field of semiconductor fabrication. In one embodiment, the material for control gate spacers 140 is conventional CVD polysilicon. In this embodiment, the polysilicon may be doped either in situ or after deposition using ion implantation. In an embodiment that uses NMOS transistors, for example, control gate spacers 140 may be doped with an n-type impurity such as arsenic or phosphorous. In other embodiments, control gate layer 140 may include a metal such as aluminum, copper, titanium, tungsten, alloys thereof, or the like.

In the depicted embodiment, the width of control gate spacers 140 is not sufficient to cover the entire floor of trench 108 and, as a result, a gap 147 exists between spacers 140 on opposing sidewalls of trenches 108. The gap 147 is substantially centrally located within trench 108 so that gap 147 is equidistant from either sidewall of trench 108. Gap 147 will be used to expose the underlying portion of semiconductor substrate 102 to form a diffusion region.

Following the formation of control gate spacers 140 in FIG. 6, a liner dielectric 145 is formed on spacers 140 to isolate the conductive spacers 140 from other electrically conductive elements of the device. Like the control gate spacers 140, one embodiment of liner dielectric 145 is formed by a spacer processing sequence in which a conformal layer of dielectric material is deposited non-selectively over the wafer and thereafter etched anisotropically to produce the liner dielectrics 145 shown in FIG. 6. For this embodiment, in which a spacer (145) is formed on another spacer (140), the etch of the first spacer (140) is preferably controlled to produce control gate spacers 140 with a relatively steep and triangular shape having a minimal horizontal surface at the top of the spacer. In this embodiment, portions of liner dielectric 145 overlying horizontal surfaces (e.g., the upper surface of top dielectric 130 overlying hard mask 106 and the upper surface of top dielectric 130 in the gap 147) may be etched without completely removing the portions liner dielectric 145 insulating control gate spacer 140. Liner dielectric 145 may be a conventional CVD oxide film such as a TEOS film. In other embodiments, liner dielectric 145 may be of a different material (e.g., silicon nitride or silicon oxynitride) that etches selectively relative to the charge storage stack 131 underlying gap 147. In still another embodiment where control gate spacer 140 is silicon or polysilicon, liner dielectric 145 may include a thermally formed silicon dioxide film.

Figure 7:
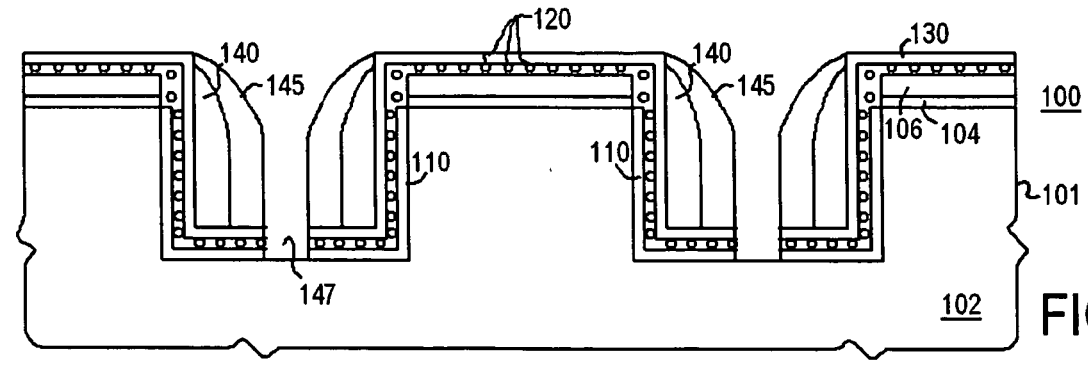
FIG. 7 depicts processing subsequent to FIG. 6 in which a portion of the charge storage stack defined by a gap between the control gate spacers is removed.

In FIG. 7, the portion of charge storage stack 131 underlying gap 147 of FIG. 6 is removed with a selective etch process to expose a relatively small portion of substrate 102 underlying gap 147. Selective removal of this portion of storage stack 131 exposes an underlying portion of semiconductor substrate. In the preferred embodiment, removing the portion of charge storage stack 131 is achieved with a conventional dry, anisotropic etch of charge storage stack 131.

Figure 8:
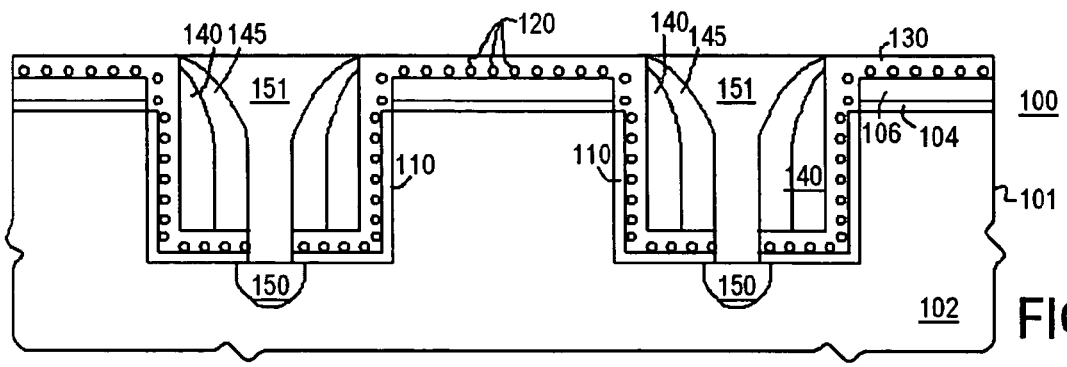
FIG. 8 depicts processing subsequent to FIG. 7 in which a diffusion regions is formed underlying the gap and the trench fill with a conductive plug.

Turning now to FIG. 8, additional processing is shown in which a diffusion region, referred to herein as control gate diffusion 150 is formed underlying the gap 147 (shown in FIG. 7) and the trench 108 filled with a conductive plug 151. The formation of control gate diffusion 150 may include an optional ion implantation step followed by a diffusion step. The conductivity type of control gate diffusion 150 is opposite the conductivity type of semiconductor substrate 102 and the impurity concentration is preferably higher than the impurity concentration of substrate 102. In an NMOS implementation, for example, control gate diffusion 150 is preferably an n+ region doped with arsenic, phosphorous, or another suitable n− type impurity while semiconductor substrate 102 is preferably a lightly p-doped material. Control gate diffusion regions 150 as shown underlie only a portion of the trench floor so that there is a portion of substrate 102 underlying a portion of trench 108 adjacent to diffusion regions 150 that will serve as a part of a channel between control gate diffusion 150 and a subsequently formed second diffusion region.

The conductive plug 151 is preferably a metal material such as tungsten, titanium, tantalum, aluminum, copper, platinum, and the like or a semiconductor such as silicon or polysilicon, or an alloy of any of them. Conductive plug 151 is an electrically conductive structure that enables back end metallization (not depicted) to contact control gate diffusion 150. Conductive plug 151 is formed in one embodiment by a process sequence including a physical vapor deposition (PVD) process, such as a sputtering process, following by a planarization step such as a chemical mechanical polish (CUT) process to produce a conductive plug having an upper surface that is substantially co-planar with an upper surface of wafer 101.

Figure 9:
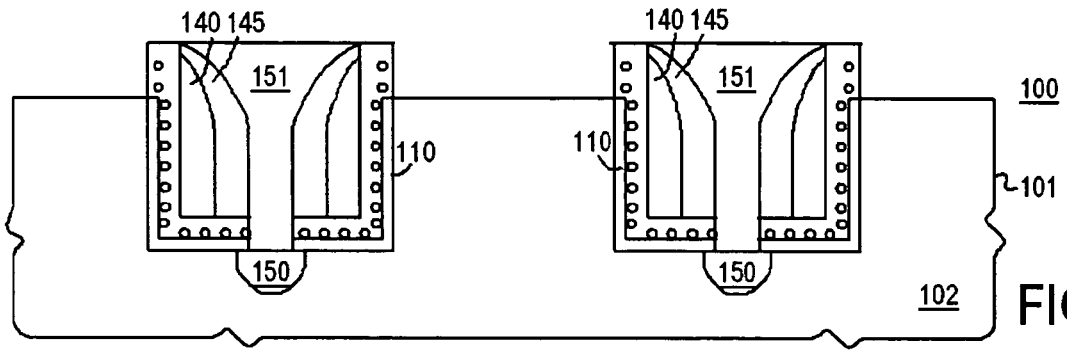
FIG. 9 depicts processing subsequent to FIG. 8 in which portions of the hard mask and dielectric stack layers are removed between boundaries of adjacent trenches.

Turning now to FIG. 9, additional processing has been performed to remaining portions of hard mask 106 and the overlying charge storage stack elements (e.g., DSEs 120 and top oxide 130) that are positioned between adjacent trenches 108. Removing the remaining portions of hard mask 106 and the overlying layers may include a photolithography process to mask the elements within trenches 108. In other embodiments, a dry etch that is selective between hard mask 106 (and the overlying layers 121 and 130) and conductive plug 151 overlying wafer 101 is used. Recalling that hard mask layer 106 is substantially thicker than either liner dielectric or layers 121 and 130, it will be appreciated that the majority of this dry etch is for etching hard mask layer 106. In embodiments where hard mask 106 is silicon nitride, the silicon nitride etch is selective to oxide embodiments of layers 130, 110, and 104 so that portions of the oxide layers are not substantially affected by the etch process depicted in FIG. 9. Removing the remaining portions of hard mask 106 as depicted in FIG. 8 includes removing the underlying dielectric liner 104 to expose an upper surface of substrate 102 between adjacent trenches 108. While the removal of dielectric liner 104 also removes exposed portions of bottom dielectric 110 and top dielectric 130, the duration of the etch required to remove dielectric liner 104 is sufficiently short to leave the portions of bottom dielectric 110 and top dielectric 130 above the substrate upper surface relatively unaffected (i.e., dielectric 110 and 130 extend above substrate 102 to a height that is substantially greater than the thickness of liner dielectric 104).

Figure 10:
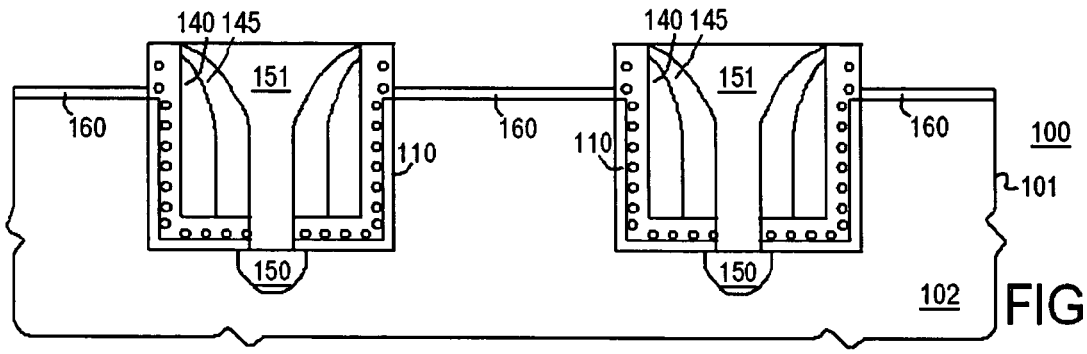
FIG. 10 depicts processing subsequent to FIG. 9 in which a select gate dielectric is formed on the substrate.

Turning now to FIG. 10, a dielectric layer 160 is formed on the exposed portions of substrate 102. Dielectric layer 160 will serve as the gate dielectric layer for select gates of split-gate device 100. In one embodiment, dielectric layer 160 is a silicon dioxide film formed by thermal oxidation of the exposed surface of substrate 102. In another embodiment, dielectric layer 160 may be is high-k dielectric such as hafnium oxide. A high k dielectric as used herein is a material having a dielectric constant that exceeds the dielectric constant of silicon dioxide.

Figure 11:
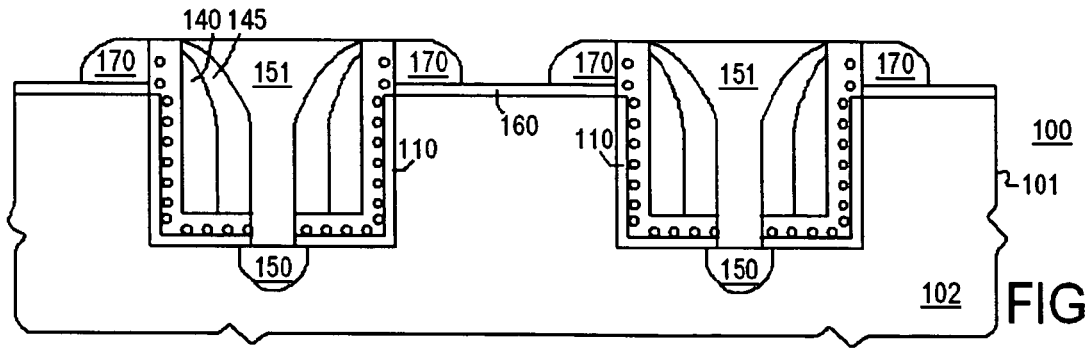
FIG. 11 depicts processing subsequent to FIG. 10 in which select gates are formed on exterior sidewalls of the charge storage stack.

Turning now to FIG. 11, select gates 170 are formed overlying the gate dielectric layer 160. In the depicted implementation, select gates 170 are spacer structures formed by depositing a conformal layer of a select gate material over wafer 101 and anisotropically etching the deposited film to create spacers on sidewalls on the portions of charge storage stack 131 that protrudes above the upper surface of substrate 102. Select gates 170 are formed of an electrically conductive material such as doped polysilicon or a metal such as titanium, tantalum, aluminum, copper, platinum, and so forth. The dimensions of select gates 170 are insufficient to completely cover the gate dielectric layer 160 overlying substrate 102 between adjacent trench structures so that a gap 172 exists between select gates 170.

Figure 12:
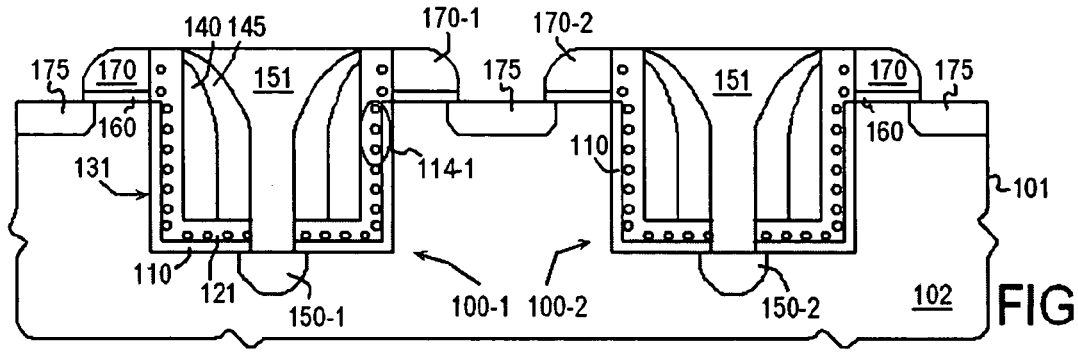
FIG. 12 depicts processing subsequent to FIG. 11 in which diffusion regions are formed in upper portions of the substrate aligned to the select gate structures.

Turning now to FIG. 12, diffusion regions 175 are formed in an upper portion of substrate 102 aligned to select gates 170. In one embodiment, the formation of diffusion regions 175 includes an etch step in which portions of gate dielectric layer 160 not covered by select gates 170 are removed. For embodiments in which gate dielectric 160 is silicon dioxide, for example, removing exposed portions of gate dielectric 160 may include dipping wafer 101 in a dilute HF solution as is well known.

The formation of diffusion regions 175 completes the formation of split gate storage device 100. The cross section shown in FIG. 12 includes first and second storage devices 100-1 and 100-2, each of which is an instance of storage device 100. Split gate storage device 100 as depicted in FIG. 11 includes a control gate spacer 140-1 and a select gate spacer 170 arranged in series between diffusion regions 150-1 and 175 wherein the diffusion regions are vertically displaced with respect to each other and where one of the gate spacers, namely, the control gate spacer 140-1 is vertically oriented along the sidewall of a trench while the other gate spacer, namely, the select gate spacer 170-1 is horizontally oriented overlying the surface of the semiconductor substrate. By orienting one of the device gates along the vertical sidewall of a trench, split gate storage device 100 is able to conserve the area required to implement the device thereby permitting a more dense population of storage devices within a given area.

Split-gate storage device 100-1 as depicted in FIG. 12 includes a diffusion region 150-1 underlying a central portion of a trench 108 in substrate 102. The trench sidewalls and a portion of the trench floor are lined with a charge storage stack 131. The preferred embodiment of charge storage 131 includes a charge storage layer 121 between a bottom dielectric layer 110 and a top dielectric layer 130. Charge storage layer 121 is preferably implemented as a plurality of silicon DSEs 120.

Storage device 100-1 further includes a control gate spacer 140-1 located at least partially in the trench adjacent to charge storage stack 131 on a substantially vertical sidewall of the trench and on top of the portion of charge storage stack 131 that lines the trench floor. Charge storage stack 131 serves as the gate dielectric for control gate spacer 140-1. Control gate spacer 140-1 is an electrically conductive structure preferably formed of doped polysilicon or another suitable conductive material. In the depicted embodiment, control gate spacer 140-1 is primarily vertically oriented meaning that the major operative surface of control gate spacer 140-1 (the surface adjacent to the trench sidewall) lies in a plane that is perpendicular to an upper source of substrate 102. Split gate storage device 100-1 further includes a select gate spacer 170-1 that is above an upper surface of the substrate 102 overlying a select gate dielectric 160 and oriented horizontally meaning that the major operative surface of select gate spacer 170-1 is parallel to the substrate upper surface. Control gate 140 is configured to create a channel in substrate 102 adjacent to the vertical trench sidewall and underlying the trench floor in the vicinity of diffusion region 150. Select gate 170 is configured to create a channel in substrate 102 at an upper surface of the substrate in the vicinity of the diffusion region 175. Together, control gate 140 and select gate 170 are configured to control a channels extending from the diffusion region 175 occupying an upper surface of substrate 102 to control gate diffusion region 150 underlying the trench. In this configuration, control gate 140 and select gate 170 are said to be arranged in series between diffusion regions 175 and 150 with control gate 140 being responsible for the vertically oriented portion of the channel and select gate 170 being responsible for a horizontal portion of the channel at the substrate upper surface.

Programming of split gate storage device 100 includes injecting charge into an injection region 114-1 of charge storage layer 121. Programming device 100 is achieved by biasing control gate 140-1 to a first programming voltage ($V_{P1}$), first select gate 170-1 to a second programming voltage ($V_{P2}$), diffusion region 150-1 to a third programming voltage ($V_{P3}$), and diffusion region 175 and substrate 102 to a fourth programming voltage ($V_{P4}$). In one implementation of a NMOS embodiment of split gate storage device 100-1, $V_{P1}$ is approximately 6 V, $V_{P2}$ is approximately 5 V, and the $V_{P4}$ is ground. The select gate programming voltage $V_{P3}$ varies depending upon the desired programming current. In a low programming current application, $V_{P3}$ may be biased at or slightly below the threshold voltage of select gate 170-1. Erasing split gate storage cell 100-1 may be achieved by biasing control gate 140-1 to a relatively large positive or negative potential $V_{E1}$ (e.g., +6 V or −6 V) and substrate 102 to a large negative or positive voltage $V_{E2}$ (e.g., −6 V or +6 V). The diffusion regions 150-1 and 175 and select gate 170-1 may be floated (no connection) during erase operations, or biased such that the voltage between diffusion region 175 and select gate 170-1 is below the breakdown voltage of the select gate dielectric 160. These programming voltages are summarized in the programming table 180 of FIG. 18. The split gate storage device 100-2 shown in FIG. 12 is functionally equivalent to storage device 100-1 and programming is achieved by substituting the bias applied to storage device 100-1 to storage device 100-2.

Figure 13:
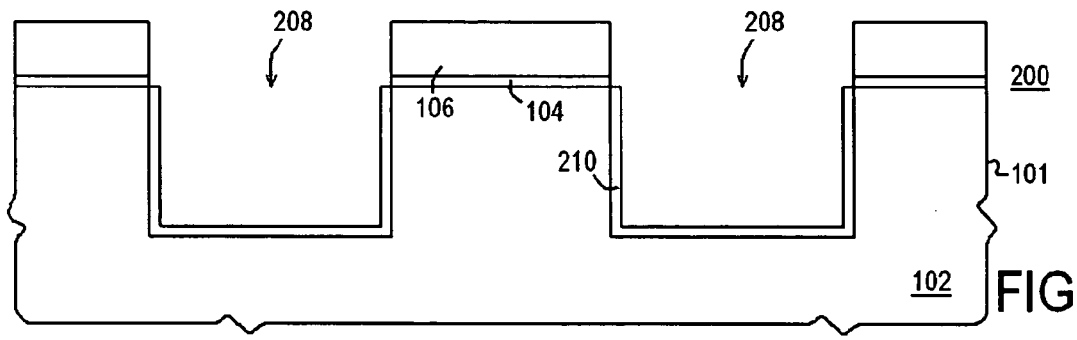
FIG. 13 depicts processing subsequent to FIG. 2 according to a second embodiment, in which the trenches are lined with a dielectric.

Turning now to FIG. 13 through FIG. 17, the fabrication of a second embodiment of split gate storage device 200 is depicted as a series of partial cross sectional views. Split gate storage device 200 is implemented with a vertically oriented select gate and a horizontally oriented control gate. In FIG. 13, a liner dielectric 210 is deposited or thermally formed to line the surfaces of trenches 208. For embodiments in which liner dielectric is retained for use as a gate dielectric, it is preferable to use thermal oxidation to form liner dielectric 210.

Figure 14:
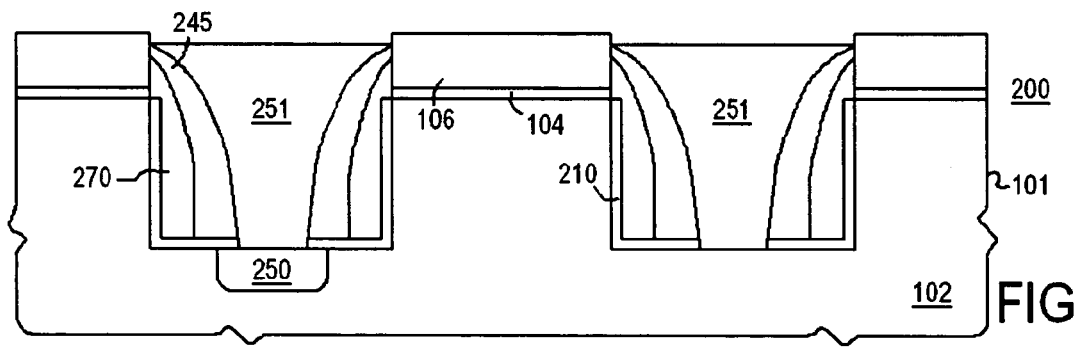
FIG. 14 depicts processing subsequent to FIG. 13 in which select gate spacers are formed in the trenches adjacent the trenches sidewalls, dielectric liners formed on the select gate spacers, diffusion regions formed underlying a gap defined by the spacers, and a conductive plug deposited to fill the trench.
Figure 15:
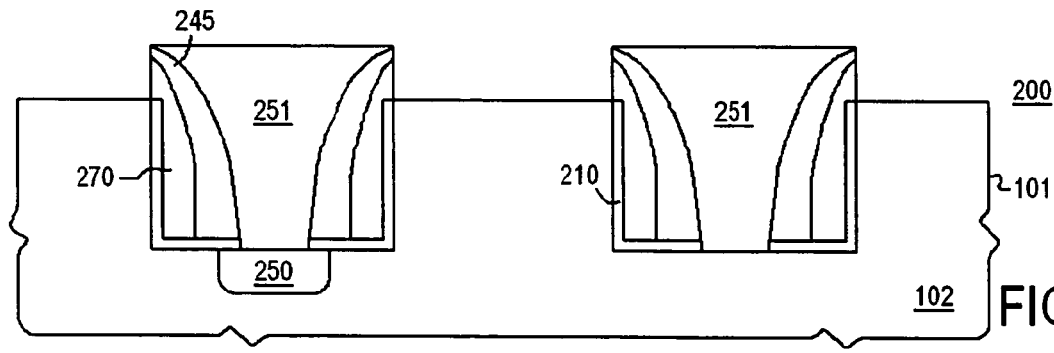
FIG. 15 depicts processing subsequent to FIG. 14 in which portions of the hard mask is removed between adjacent trenches.

Referring to FIG. 14, additional processing, analogous to the processing described above with respect to FIG. 7 through FIG. 9, is performed to form select gate spacers 270 in trenches 208 adjacent to and overlying a dielectric 210 that lines the trench sidewalls and which serves as the gate dielectric for select gate spacer 270. Select gate spacers 270 are formed of polysilicon or another suitable conductive material. Dielectric spacers 245 line select gate spacers. A diffusion region 250 underlying a central portion of a trench 208 is formed in substrate 102 aligned to select gate spacers 270 and a conductive plug 251 has been fabricated to fill trench 208. Dielectric spacers 245 isolate select gate spacers 270 from conductive plug 251. In FIG. 15, portions of dielectric 210, hard mask 106, and dielectric liner 104, have been removed overlying portions of substrate 102 between adjacent trenches 208 analogous to the processing described above with respect to FIG. 9.

In FIG. 16, additional processing is performed to form a charge storage stack 231 on the exposed surfaces of substrate 102. Charge storage stack 231 includes a layer of DSEs 220 overlying a bottom dielectric and underlying a top dielectric analogous to the charge storage stack 131 of FIG. 5. (At the level of detail shown in FIG. 16, the top and bottom dielectrics are not readily distinguishable within charge storage stack 231). Portions of charge storage stack above plug 251 have been removed with a CMP process in one embodiment. Control gate spacers 240 are shown as formed overlying charge storage stack 231 adjacent sidewalls of trench 208. Control gate spacers 240 may be comprised of polysilicon or another suitable gate electrode material.

In FIG. 17, exposed portions of charge storage stack 231 (portions not covered by control gates spacers 240, are removed to expose the semiconductor substrate 102. Thereafter, diffusion regions 275 are formed in substrate 102 aligned to the control gate spacers 240 to complete the formation of first and second split gate storage devices 200-1 and 200-2.

Split gate storage device 200-1 includes a select gate spacer 270-1 and a control gate 240-1 arranged in series between diffusion regions 250-1 and 275. In the depicted embodiment, select gate spacer 270-1 is a vertically oriented structure within a trench 208. Select gate spacer 270-1 is located at least partially in the trench positioned adjacent to gate dielectric 270, which lines the substantially vertical trench sidewalls and a portion of the trench floor. Control gate spacers 240 are horizontally oriented spacers that overlie a charge storage stack 231 above an upper surface of substrate 102. In this embodiment, the majority of a channel formed between diffusion region 250 and diffusion regions 275 is controlled by select gate spacers 270 while a smaller portion of the channel is controlled by control gate spacers 240. Programming of an injection region 214-1 of DSEs 220 is similar to the programming of injection region 114 of FIG. 12, with the injection region comprising the DSEs underlying spacers 240. Programming values for storage device 200 are depicted in table 180 of FIG. 18.

Figure 19:
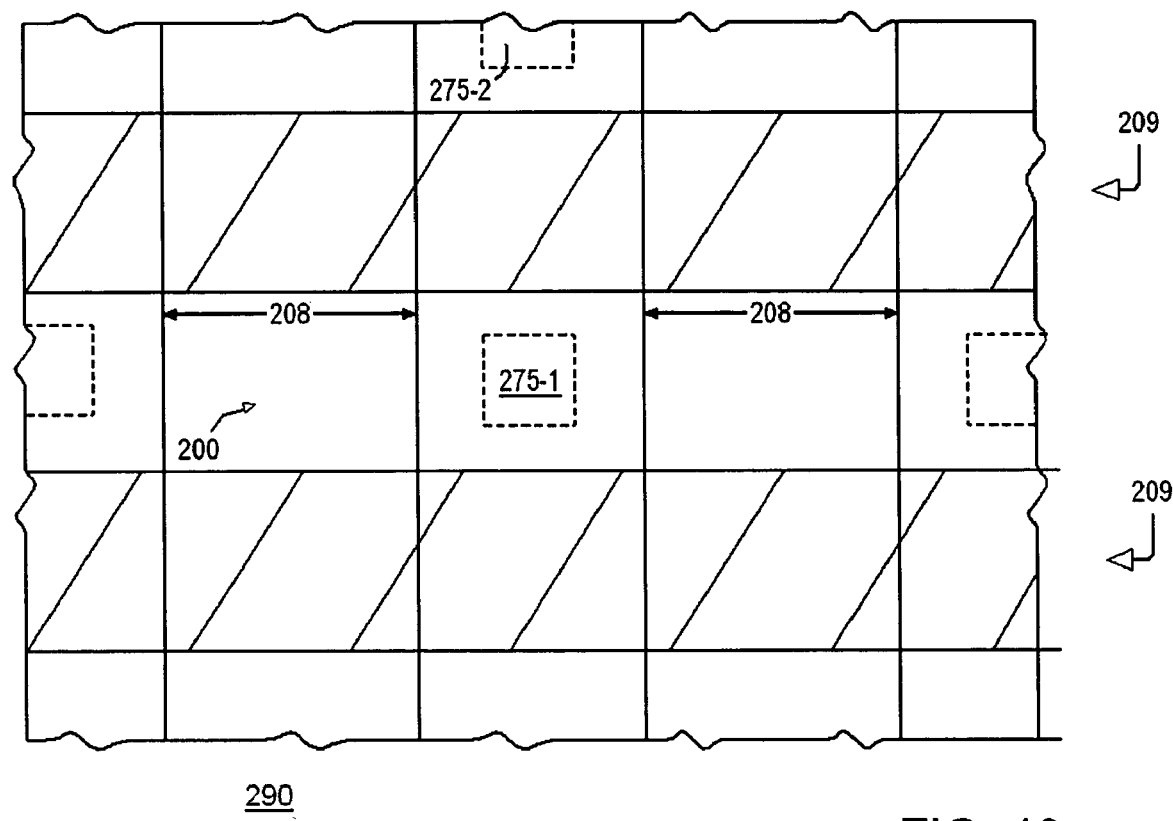
FIG. 19 is a top view of a split gate device storage array emphasizing device isolation.

Turning now to FIG. 19, a top view of a portion of a storage array 290 is shown to discuss isolation of individual devices within the array. From the top view as seen in FIG. 19, trenches 208 run vertically. A storage device 200 is shown as including first trench 208-1, a second trench 208-2, and a diffusion region 275 in between. Control gate spacers 240, select gate spacers 270, and other features of device 200 are omitted from FIG. 19 for the sake of clarity. Rows or stripes of isolation regions 209 are shown in FIG. 19 to provide electrical isolation between neighboring diffusion regions 275 (e.g., between diffusion regions 275-1 and 275-2. Isolation stripes 209 may be implemented with an implant or with a deep trench isolation dielectric in which a dielectric isolation trench, formed before trenches 208 are formed, extends below the depth of trenches 208. In the junction isolation embodiment, isolation stripes 209 are implanted with a species that reinforces the conductivity type of substrate 102. In an NMOS embodiment of storage devices 200, for example, diffusion regions 275 are n+ regions, substrate 102 is a p– region, and isolation stripes 209 are p regions.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment is an NMOS transistor embodiment, PMOS embodiments are equally encompassed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A split gate memory cell comprising:
   a first gate electrode;
   a second gate electrode;
   a first diffusion region underlying trench in a semiconductor substrate, wherein the trench has a sidewall, and the first diffusion region lies closer to the first gate electrode than the second gate electrode;
   a second diffusion region lying outside the trench, wherein the second diffusion region lies closer to the second gate electrode than the first gate electrode; and
   a charge storage layer adjacent to the sidewall of the trench, wherein the charge storage layer includes discontinuous storage elements (DSEs).

2. The split gate memory cell of claim 1, wherein from a top view, the charge storage layer lies within the trench.

3. The split gate memory cell of claim 2, wherein the fist gate electrode is a control gate electrode located at least partially within the trench.

4. The split gate memory cell of claim 3, wherein the control gate electrode comprises a control gate spacer adjacent to the charge storage layer.

5. The split gate memory cell of claim 3, wherein the second gate comprises a select gate electrode lying outside the trench.

6. The split gate memory cell of claim 5, wherein the select gate electrode and the control gate electrode are the only gate electrodes of the split gate memory cell.

7. The split gate memory cell of claim 2, wherein the DSEs comprises silicon nanocrystals.

8. The split gate memory cell of claim 2, further comprising a conductive plug extending into the trench and contacting the first diffusion region.

9. The split gate memory cell of claim 1, wherein the first gate electrode is a select gate electrode.

10. The split gate memory cell of claim 9, wherein the charge storage layer lies outside the trench.

11. The split gate memory cell of claim 10, wherein the select gate electrode is located at least partially within the trench.

12. The split gate memory cell of claim 11, wherein the select gate electrode includes a spacer structure adjacent to the sidewall of the trench.

13. A method of using a split gate memory array comprising erasing a split gate memory cell within the split gate memory array, wherein erasing includes:
   providing a split gate memory cell comprising:
      a first gate electrode;
      a second gate electrode;
      a first diffusion region underlying a trench in a semiconductor substrate, wherein the trench has a sidewall, and the first diffusion region lies closer to the first gate electrode than the second gate electrode:
      a second diffusion region lying outside the trench, wherein the second diffusion region lies closer to the second gate electrode than the first gate electrode; and
      a charge storage layer adjacent to the sidewall of the trench, wherein:
         the charge storage layer includes discontinuous storage elements;
         one of the first gate electrode and the second gate electrode includes a control gate electrode; and
         another of the first gate electrode and the second gate electrode includes a select gate electrode;

biasing the control gate electrode to a first erasing voltage; and floating the select gate.

14. The method of claim 13, wherein during erasing, floating the select gate comprises floating all select gates within the split gate memory array.

15. A method of fabricating a split gate memory cell comprising:

forming a trench in a semiconductor substrate;

forming a charge storage layer after forming the trench, wherein forming the charge storage layer includes forming discontinuous storage elements;

forming a first gate electrode at least partially within the trench;

forming a second gate electrode outside the trench;

forming a first diffusion region underlying the trench;

forming a second diffusion region lying outside the trench.

16. The method of claim 15, wherein forming the first gate electrode includes forming a control gate electrode.

17. The method of claim 16, wherein forming the charge storage layer includes forming the charge storage layer over a bottom surface of the trench.

18. The method of claim 15, wherein forming the first gate electrode comprises forming a conductive spacer adjacent a sidewall of the trench.

19. The method of claim 15, wherein the first gate electrode is a select gate electrode.

20. The method of claim 19, wherein the charge storage layer lies outside the trench.

* * * * *

UNITED STATES PATENT AND TRADEMARK OFFICE
CERTIFICATE OF CORRECTION

| | | |
|---|---|---|
| PATENT NO. | : 7,211,858 B2 | Page 1 of 1 |
| APPLICATION NO. | : 11/188603 | |
| DATED | : May 1, 2007 | |
| INVENTOR(S) | : Erwin J. Prinz | |

It is certified that error appears in the above-identified patent and that said Letters Patent is hereby corrected as shown below:

Column No. 10, Line No. 32, change "comprises" to --comprise--

Signed and Sealed this

Twenty-seventh Day of November, 2007

JON W. DUDAS
*Director of the United States Patent and Trademark Office*